(12) United States Patent
Chang

(10) Patent No.: US 6,836,174 B1
(45) Date of Patent: Dec. 28, 2004

(54) TRANSISTOR STRUCTURE WITH THERMAL PROTECTION

(75) Inventor: Chung-Hsing Chang, Taoyuan Hsien (TW)

(73) Assignee: Arima Computer Corporation, Taipei (TW)

( * ) Notice: Subject to any disclaimer, the term of this patent is extended or adjusted under 35 U.S.C. 154(b) by 0 days.

(21) Appl. No.: 10/463,061

(22) Filed: Jun. 17, 2003

(51) Int. Cl.⁷ .............................................. H01L 35/00
(52) U.S. Cl. ...................................... 327/513; 327/378
(58) Field of Search ................................ 327/378, 512, 327/513

(56) References Cited

U.S. PATENT DOCUMENTS

| 4,896,245 A | * | 1/1990 | Qualich | ...................... | 361/103 |
| 6,340,878 B1 | * | 1/2002 | Oglesbee | ..................... | 320/150 |

* cited by examiner

*Primary Examiner*—Kenneth B. Wells
(74) *Attorney, Agent, or Firm*—Timothy J. Keefer; Seyfarth Shaw LLP

(57) ABSTRACT

A new transistor structure with thermal protection is provided. A type of the new transistor structure of the present invention includes a main depletion-mode NMOSFET and a control PMOSFET, with the drain terminal of the control PMOSFET connected to the gate terminal of the main NMOSFET and the gate terminal of the control PMOSFET connected to a thermal protection unit. The two-MOSFET structure as a whole emulates a normal NMOSFET. The source terminal of the control PMOSFET that's not connected to the gate terminal of the main NMOSFET acts as the gate terminal of the new transistor structure, and the drain and source terminals of the new transistor structure are the drain and source terminals of the main NMOSFET. The thermal protection unit prevents thermal failures of the MOSFETs of the new transistor structure by sensing heat, terminating current through and switching the two MOSFETs.

16 Claims, 2 Drawing Sheets

TRANSISTOR STRUCTURE WITH THERMAL PROTECTION

BACKGROUND OF THE INVENTION

1. Field of the Invention

The present invention relates to thermal protection of metal-oxide-semiconductor field-effect transistor (MOSFET) devices, and more particularly to a transistor structure with thermal protection.

2. Description of the Related Art

The MOSFET components burnt out problem is often encountered in many different applications and situations. Normally a MOSFET can be operated at a junction temperature of 150 degrees Celsius but it could burn out if the heat energy inside raises the temperature to over 300 degrees Celsius. Heat can transfer by conduction, convection or radiation. Temperature changes met during MOSFET device fabrication, storage, and operation are not often large enough to place limits on component characterization and lifetime if circuit design is suitable. But the burnt out issue is still possible to occur at some abnormal conditions of fabrication, transportation, operation and insufficient design margin of circuit including MOSFET components.

During operation, components experience individually their own internal warming and thus temperature rise. The internal warming may be due to current passing through the components and comes from, for example, internal resistance of a component or switching loss. Besides, external warming is also significant. A component is influenced by external heat from other components or the environment. For integrated devices, the space between components is extremely small or the components are actually touching one another. There is little chance for convectional cooling and the spread of heat can cover many components readily. The combination of internal and external warming can lead to thermal failures of the MOSFET components if some abnormal conditions exist.

Thermal failure is the temporary or permanent impairment of component or system functions caused by thermal disturbance or damage. Thermally enhanced failures, such as oxide wearout, fracturing, package delamination, wire bond breakage, deformation of metallization on the chip, and cracks and voids in the chip, substrate, die bond, and solder joins lead to reliability limitations. Besides, the burnt out problem is a serious thermal failure result and poses critical safety concerns since it can cause smoke, fire, and melting of plastic materials. The burnt out problem could come from cold solder, poor gate drive, MOSFET itself, etc.

Specifically, MOSFET components burnt out problem is sometimes found when the MOSFET components are used for power applications such as DC-to-DC converters, batteries, and switches. Referring to FIG. 1 as an example, a pulse-width-modulated (PWM) DC-to-DC buck circuit is shown. The switching regulator shown in FIG. 1 converts the unregulated DC input voltage $V_{in}$ across the filter capacitor $C_{in}$ of a previous stage to the desired regulated DC output voltage $V_o$. $L_f$ and $C_f$ constitute the output filter of the buck circuit. Thermal failures may happen to the two power transistors (pass component $M_p$ and rectifier $M_n$). The pass component $M_p$ can be a PMOS transistor and the rectifier $M_n$ can be an NMOS transistor. To prevent MOSFET burnt out problems, conventionally overheat protection components such as thermal fuses are added to interrupt the current flow through the MOSFET components if the heating effect of the current exceeds the thermal rating of the fusible element within the fuse. If the temperature exceeds the rating of the fuse, then the heat generated by the current melts the fusible element thereby interrupting the current flow (opening the circuit).

Thermal fuses can be put in series with and in close proximity to the MOS transistors or IC chips to be protected. There are disadvantages of using thermal fuses. First, fuses are usually one-shot, that is they cannot be used repeatedly. Second, open circuit caused directly by the thermal failure of the MOSFET itself can happen with the series thermal fuse intact. Since MOSFET components burn out first and then thereby become short or open circuit, doing conventional open or short circuit test may not correctly identify the cause of the circuit failure. Third, soldering the thermal fuse in the close proximity of the component being protected or reflow process may be harmful to the component. In conclusion, putting thermal fuses affects the cost, size, contact situations, etc of MOSFET components and causes such disadvantages as described above.

For the forgoing reasons, thermal protection of the MOSFET components cannot be achieved effectively by using thermal fuses. Therefore, a solution for thermal protecting MOSFET components is needed.

SUMMARY OF THE INVENTION

Accordingly, a new solution for achieving thermal protection of MOSFET components is needed and necessary. The object of the present invention is to provide a new transistor structure, as the solution, with a thermal protection unit built inside. A new transistor structure of the present invention includes a main depletion-mode NMOSFET and a control PMOSFET, with the drain terminal of the control PMOSFET connected to the gate terminal of the main NMOSFET and the gate of the control PMOSFET connected to a thermal protection unit. The two-MOSFET structure as a whole emulates a normal NMOSFET. The source terminal of the control PMOSFET that's not connected to the gate of the main NMOSFET acts as the gate terminal of the new transistor structure, and the drain and source terminals of the new transistor structure are the drain and source terminals of the main NMOSFET. The threshold voltage of the new transistor structure is around the threshold voltage of the main NMOSFET. Similarly, another new transistor structure is composed of a main depletion-mode PMOSFET, a control NMOSFET and a thermal protection unit and emulates a normal PMOSFET.

For the first new transistor structure described above, the control PMOSFET must be turned on, when the voltage on the gate of the new transistor structure with reference to the voltage on the source of the new transistor structure exceeds the threshold voltage of the new transistor structure. To protect the new transistor from burning out when the temperature during component operation is very high, for instance higher than about 150 degrees Celsius, the control PMOSFET should be turned off regardless of the voltage on the gate terminal of the new transistor structure.

In conclusion, using the new transistor structure, with the internal thermal protection unit properly designed, as a normal MOSFET in various applications can prevent the MOSFETs of the transistor from having thermal failures, and can eliminate the disadvantages of conventional overheat protection components such as thermal fuses.

DESCRIPTION OF THE PREFERRED EMBODIMENTS

Figure 1:
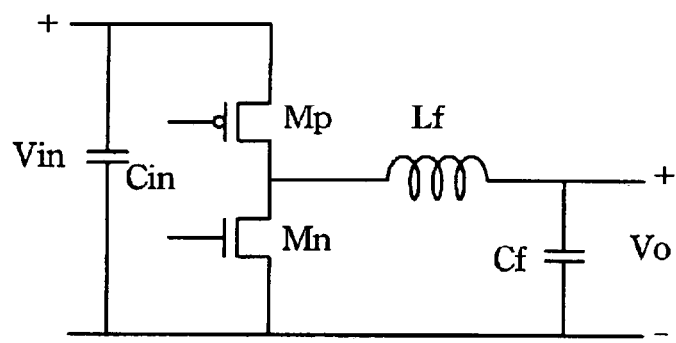
FIG. 1 is a pulse-width-modulated (PWM) DC-to-DC buck circuit containing two power transistors.
Figure 2:
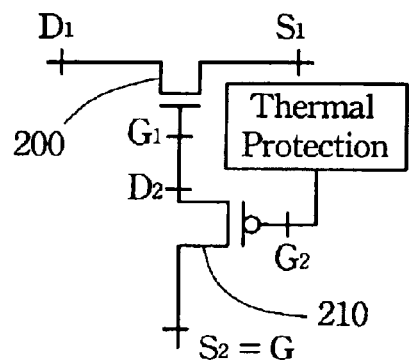
FIG. 2 is a type of the new transistor structure of the present invention.
Figure 3:
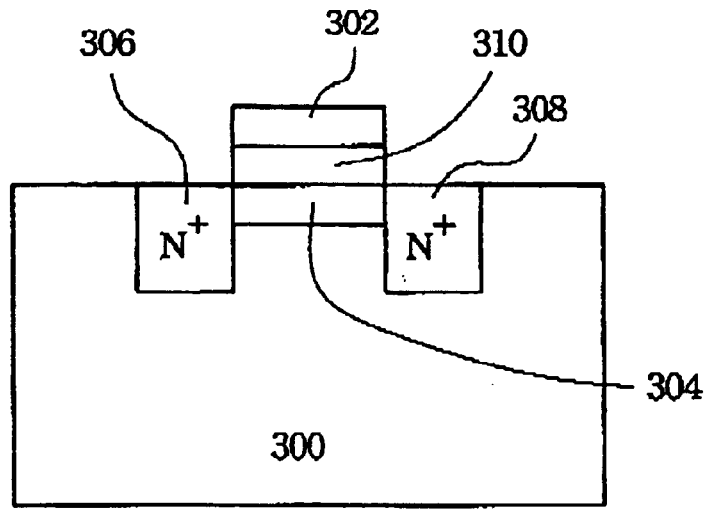
FIG. 3 is a simple cross-sectional view of a normal NMOSFET.

Two embodiments of the present invention are described here in more detail to give a better understanding of the invention. An embodiment of the invention is a type of the new transistor structure that emulates a normal NMOSFET. FIG. 2 is a circuit diagram of the transistor structure. In FIG. 2, the new transistor structure encompasses a main NMOSFET 200 and a minor or control PMOSFET 210. For giving a brief introduction of a normal MOSFET, a simple cross-sectional view of a normal NMOSFET is shown in FIG. 3. Referring to FIG. 3 briefly, a normal NMOSFET is a transistor that uses a control electrode, the gate 302, to capacitively modulate the conductance of a surface channel 304 joining two end contacts, the $N^+$ source 306 and the $N^+$ drain 308. P type semiconductor substrate or body 300 is the portion of the NMOSFET that lies between the source 306 and drain 308 and under the gate 302. The gate 302 is separated from the body 300 by a thin gate insulator 310, usually silicon dioxide. The channel 304 is a conducting region between the source 306 and drain 308 formed by attraction of carriers at the interface between the semiconductor body 300 and the gate insulator 310. When the gate bias exceeds threshold voltage of the NMOSFET, the carriers form the conducting channel 304. The gate insulator 310 prevents the channel 304 from reaching the gate 302. In brief, the gate 302 modulates the conductivity of the channel 304, providing a gate-controlled resistance between the source 306 and drain 308. As to another common type of MOSFET, PMOSFET, the body is N type semiconductor and the source and drain are $P^+$ material.

Referring back to FIG. 2, the drain, source and gate of the main NMOSFET 200 are denoted as D1, S1, and G1 respectively. The drain, source and gate of the minor PMOSFET 210 are denoted as D2, S2, and G2 respectively. The drain D2 of the minor PMOSFET 210 is connected to the gate G1 of the main NMOSFET 200, and the gate G2 of the minor PMOSFET 210 is connected to a thermal protection unit. The two-MOSFET structure as a whole emulates a normal NMOSFET. The source S2 of the minor PMOSFET 210 acts as the gate G of the new transistor structure, and the drain and source of the new transistor structure are the drain D1 and source S1 of the main NMOSFET 200. The threshold voltage of the new transistor structure is around the threshold voltage of the main NMOSFET 200. It is to be understood that if the main NMOSFET 200 is a depletion-mode NMOSFET, the control PMOSFET 210 can be either an enhancement-mode PMOSFET or a depletion-mode PMOSFET. If the main NMOSFET 200 is an enhancement-mode NMOSFET, the control PMOSFET 210 can only be a depletion-mode PMOSFET.

The thermal protection unit is used to provide current and/or heat sensing and limiting for thermal protection, as well as control of the switching of the two MOSFETs. When the voltage on the gate G of the new transistor structure with reference to the voltage on the source S1 of the new transistor structure exceeds the threshold voltage of the new transistor structure, the minor PMOSFET 210 must be turned on by the voltage on G2 controlled by the thermal protection unit, and then in turn the main NMOSFET 200 is turned on accordingly. To protect the two MOSFETs of the transistor from burning out when the temperature during component operation is higher than about 150 degrees Celsius, the minor PMOSFET 210 should be turned off regardless of the voltage on the gate G of the new transistor structure. Besides, since an elevated temperature of about 200 degrees Celsius is required during the reflow phase of the reflow soldering process for implementing SMT (Surface Mount Technology) for the IC chip, the thermal protection unit must be able to bear this high temperature or no device operation at the condition of no power source, which is different than thermal fuse.

Figure 4:
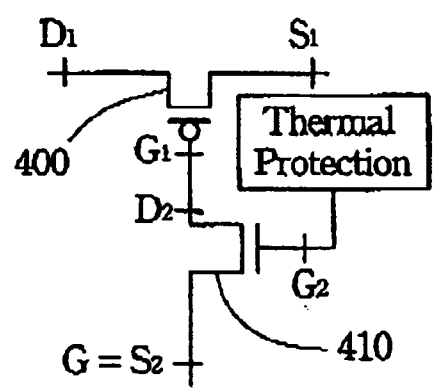
FIG. 4 is another type of the new transistor structure of the present invention.

Another embodiment of the invention is another type of the new transistor structure that emulates a normal PMOSFET. FIG. 4 is a schematic of the transistor structure. Referring to FIG. 4, the new transistor structure contains a main PMOSFET 400 and a minor or control NMOSFET 410. The drain, source and gate terminals of the main PMOSFET 400 are denoted as D1, S1, and G1 respectively. The drain, source and gate of the minor NMOSFET 410 are denoted as D2, S2, and G2 respectively. The drain D2 of the minor NMOSFET 410 is connected to the gate G1 of the main PMOSFET 400, and the gate G2 of the minor NMOSFET 410 is connected to a thermal protection unit. The two-MOSFET structure as a whole emulates a normal PMOSFET. The source S2 of the minor NMOSFET 410 acts as the gate G of the new transistor structure, and the drain and source of the new transistor structure are the drain D1 and source S1 of the main PMOSFET 400. The threshold voltage of the new transistor structure is around the threshold voltage of the main PMOSFET 400 and is negative. Again, the thermal protection unit is to provide current sensing and limiting for thermal protection, as well as control of the switching of the two MOSFETs. It is to be understood that if the main PMOSFET 400 is a depletion-mode PMOSFET, the control NMOSFET 410 can be either an enhancement-mode NMOSFET or a depletion-mode NMOSFET. If the main PMOSFET 400 is an enhancement-mode PMOSFET, the control NMOSFET 410 can only be a depletion-mode NMOSFET.

When the voltage on the gate G of the new transistor structure with reference to the voltage on the source S1 of the new transistor structure is below the negative threshold voltage of the new transistor structure, the minor NMOSFET 410 must be turned on by the voltage on G2 controlled by the thermal protection unit, and then in turn the main PMOSFET 400 is turned on. To protect the two MOSFETs of the transistor from burning out when the temperature during component operation is higher than about 150 degrees Celsius, the minor NMOSFET 410 should be turned off regardless of the voltage on the gate G of the new transistor structure. Also the thermal protection unit must be able to bear a high temperature over 200 degrees Celsius required or no device operation at the condition of no power source during reflow soldering process.

It's to be understood that different designs of the thermal protection unit can be adopted to achieve its functions in the new transistor structure of the present invention. Different realizations can be made as long as the new transistor structure is employed and not departing from the scope and spirit of the appended claims.

What is claimed is:

1. A transistor structure, comprising:
    a main depletion mode NMOSFET having a first drain terminal, a first source terminal, and a first gate terminal;
    a control PMOSFET having a second drain terminal conductively connected to said first gate terminal, a second source terminal, and a second gate terminal; and
    a thermal protection unit which is conductively coupled to said second gate terminal for preventing thermal failures of the transistor structure due to high temperature or thermal effects by turning off the control PMOSFET when any temperature in the transistor structure exceeds a specified value, and thereby the main depletion-mode NMOSFET being regulated,
    wherein said second source terminal, said first drain terminal, and said first source terminal act as the gate terminal, drain terminal, and source terminal of the transistor structure respectively.

2. The transistor structure of claim 1, wherein the control PMOSFET is an enhancement-mode PMOSFET.

3. The transistor structure of claim 1, wherein the control PMOSFET is a depletion-mode PMOSFET.

4. The transistor structure of claim 1, wherein the thermal protection unit is able to bear a temperature required by and during the reflow soldering process for implementing SMT (Surface Mount Technology) for the MOSFET components chip.

5. A transistor structure, comprising:
 a main depletion-mode PMOSFET having a first drain terminal, a first source terminal, and a first gate terminal;
 a control NMOSFET having a second drain terminal conductively connected to said first gate terminal, a second source terminal, and a second gate terminal; and
 a thermal protection unit which is conductively coupled to said second gate terminal for preventing thermal failures of the transistor structure due to high temperature or thermal effects by turning off the control NMOSFET when any temperature in the transistor structure exceeds a specified value, and thereby the main depletion mode PMOSFET being regulated,
 wherein said second source terminal, said first drain terminal, and said first source terminal act as the gate terminal, drain terminal, and source terminal of the transistor structure respectively.

6. The transistor structure of claim 5, wherein the control NMOSFET is an enhancement-mode NMOSFET.

7. The transistor structure of claim 5, wherein the control NMOSFET is a depletion-mode NMOSFET.

8. The transistor structure of claim 5, wherein the thermal protection unit is able to bear a temperature required by and during the reflow soldering process for implementing SMT for the MOSFET components chip.

9. A transistor structure, comprising:
 a main NMOSFET having a first drain terminal, a first source terminal, and a first gate terminal;
 a control depletion-mode PMOSFET having a second drain terminal conductively connected to said first gate terminal, a second source terminal, and a second gate terminal; and
 a thermal protection unit which is conductively coupled to said second gate terminal for preventing thermal failures of the transistor structure due to high temperature or thermal effects by turning off the control depletion-mode PMOSFET when any temperature in the transistor structure exceeds a specified value, and thereby the main NMOSFET being regulated,
 wherein said second source terminal, said first drain terminal, and said first source terminal act as the gate terminal, drain terminal, and source terminal of the transistor structure respectively.

10. The transistor structure of claim 9, wherein the main NMOSFET is an enhancement-mode NMOSFET.

11. The transistor structure of claim 9, wherein the main NMOSFET is a depletion-mode NMOSFET.

12. The transistor structure of claim 9, wherein the thermal protection unit is able to bear a temperature required by and during the reflow soldering process for implementing SMT for the MOSFET components chip.

13. A transistor structure, comprising:
 a main PMOSFET having a first drain terminal, a first source terminal, and a first gate terminal;
 a control depletion-mode NMOSFET having a second drain terminal conductively connected to said first gate terminal, a second source terminal, and a second gate terminal; and
 a thermal protection unit which is conductively coupled to said second gate terminal for preventing thermal failures of the transistor structure due to high temperature or thermal effects by turning off the control depletion-mode NMOSFET when any temperature in the transistor structure exceeds a specified value, and thereby the main PMOSFET being regulated,
 wherein said second source terminal, said first drain terminal, and said first source terminal act as the gate terminal, drain terminal, and source terminal of the transistor structure respectively.

14. The transistor structure of claim 13, wherein the main PMOSFET is an enhancement-mode PMOSFET.

15. The transistor structure of claim 13, wherein the main PMOSFET is a depletion-mode PMOSFET.

16. The transistor structure of claim 13, wherein the thermal protection unit is able to bear a temperature required by and during the reflow soldering process for implementing SMT for the MOSFET components chip.

* * * * *